US006123553A

United States Patent [19]

Kobayashi et al.

[11] Patent Number: 6,123,553

[45] Date of Patent: Sep. 26, 2000

[54] BRANCH JUNCTION BOX ASSEMBLY

[75] Inventors: Makoto Kobayashi; Yukinori Kita, both of Yokkaichi, Japan

[73] Assignee: Sumitomo Wiring Systems, Ltd., Japan

[21] Appl. No.: 09/212,106

[22] Filed: Dec. 15, 1998

[30] Foreign Application Priority Data

Dec. 15, 1997 [JP] Japan .................................... 9-345353

[51] Int. Cl.$^{7}$ ........................................................ H05K 1/00

[52] U.S. Cl. ............................ 439/77; 439/513; 439/907

[58] Field of Search ................................ 439/67, 77, 495, 439/510, 512, 513, 907

[56] References Cited

U.S. PATENT DOCUMENTS

| | | | |
|---|---|---|---|
| 3,893,745 | 7/1975 | Codrino | 439/495 |
| 4,509,098 | 4/1985 | Das Gupta et al. | 361/398 |
| 5,051,100 | 9/1991 | Kato et al. | 439/140 |
| 5,350,309 | 9/1994 | Abukawa et al. | 439/138 |
| 5,613,872 | 3/1997 | Fukuda et al. | 439/188 |

FOREIGN PATENT DOCUMENTS

| | | |
|---|---|---|
| 0762556 | 3/1997 | European Pat. Off. . |
| 5-17971 | 3/1993 | Japan . |

*Primary Examiner*—Neil Abrams
*Attorney, Agent, or Firm*—Bierman, Muserlian and Lucas

[57] ABSTRACT

A branch junction box assembly containing a busbar and a flexible printed substrate. The busbar has a contact section extending therefrom and, similarly, the substrate has a contact portion extending therefrom. Connection between the two is made by inserting a connector into a connector holder in a position whereby the connector makes contact with both the contact section and the contact portion, thereby completing the circuit. It is preferable that the contact portion and contact section, as well as the terminals in the connector be parallel to each other and to the insertion direction of the connector into the connector holder. This provides a simple construction, minimizes the number of parts, and enables easy and smooth assembly.

16 Claims, 2 Drawing Sheets

BRANCH JUNCTION BOX ASSEMBLY

This Application claims the benefit of the priority of Japanese Application 9-345353, filed Dec. 15, 1997.

The present Invention is directed to a branch junction box assembly used to direct power from a source to various sections of an automobile or similar vehicle. More specifically, the Invention relates to a structure for connecting the connectors within the box assembly.

BACKGROUND OF THE INVENTION

Conventional devices of the general type claimed herein include a busbar and a flexible printed substrate, each of which carries a contact section. The current from the power supply goes to the busbar from which it is sent to the various load elements by the substrate, wire harnesses, and the like. A portion of the junction box constitutes a connector holder and the aforementioned contact sections are removably disposed therein. A busbar connector and a printed substrate connector are removably disposed in the connector holder; within the foregoing connectors, contact terminals are arranged to form contacts with the contact sections of the busbar and substrate. An electrical connection can be formed between the busbar and the substrate by separately fitting the busbar connector and the printed substrate connector into the connector holder.

However, such a junction box requires a busbar connector and a printed substrate connector in order to complete the connection between the two. This makes it necessary to have a larger number of parts and increases costs. Furthermore, these elements require space and this must be provided with the junction box, thereby increasing its size. Alternatively, it is possible to eliminate the connectors and solder the two sections together; however, passing these elements through a solder bath is difficult and unsuitable for mass production.

SUMMARY OF THE INVENTION

Therefore, it is an object of the present Invention to provide an improved construction whereby the number of parts required to connect the busbar and the printed substrate is reduced with the attendant savings in production costs. In addition, the present Invention allows the junction box to be smaller.

In practicing the present Invention, there is provided a branch junction box assembly which consists of one or more busbars each having at least one contact section in electrical contact therewith. Also, one or more flexible printed substrates are provided, each of which has a contact portion in electrical contact therewith. Both the contact section and the contact portion are disposed in a case carrying a connector holder and spaced apart from each other.

There is a connector which is adapted to fit a space in a case and, in that position, is in electrical contact with both the contact section and the contact portion. In this manner, the busbar and printed substrate are electrically connected to each other through the aforementioned connector.

In a preferred form of the Invention, the connector is removable from the case. Thus, the connector is inserted into the case, makes contact between the contact section and the contact portion, and can be removed therefrom. This breaks the circuit and, therefore, permits the connector to act as an on/off switch.

It is desirable for the contact section and the contact portion to be substantially parallel to each other. The connector should include a connection section having at least two terminals which are parallel to each other and also to the contact section and contact portion. The terminals are so configured that, upon insertion into the connector holder, the contact section fits between them, thereby making electrical contact with both. One of the terminals is also in contact with the contact portion of the flexible printed substrate. In this manner, the complete circuit is formed between the busbar and the substrate in a very simple and economical manner.

Advantageously, there is a projection into the space and the contact portion rests thereon. In this manner, the terminal can bear firmly against it without risk of distortion. When the connection is made, the contact portion is sandwiched between one of the terminals and the projection.

It is preferable that the terminals be resilient as an added safety factor in ensuring good electrical contact. It is also desirable that the connection section of the connector be complementary to the case; in this way, the connector fits neatly and firmly in the body of the junction box without looseness.

BRIEF DESCRIPTION OF THE DRAWINGS

In the accompanying drawings, constituting a part hereof, and in which like reference characters indicate like parts.

DETAILED DESCRIPTION OF THE INVENTION

Figure 1:
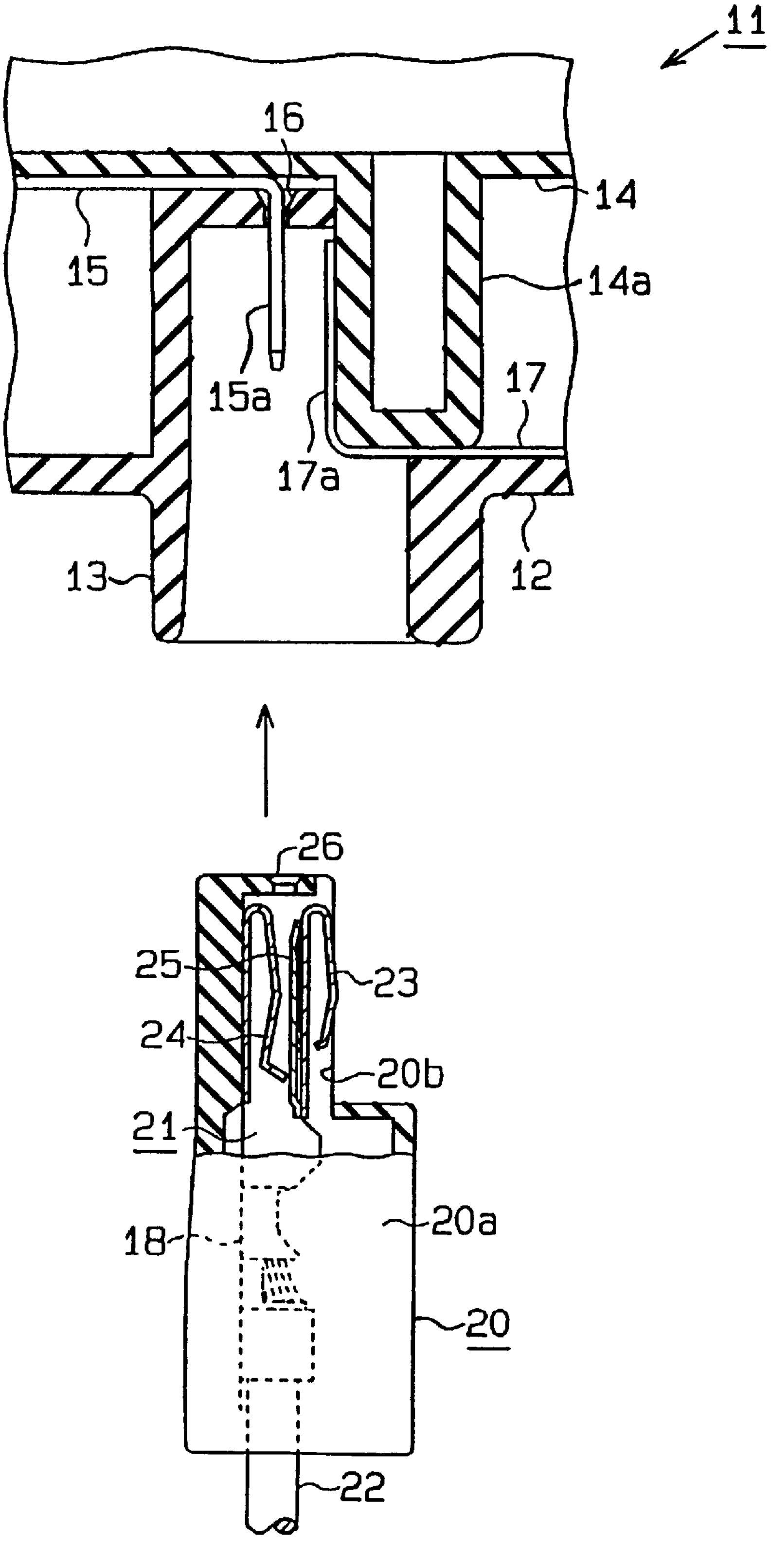
FIG. 1 is an exploded view, partly in section, showing the connector and the junction box separated.

Branch junction box 11 contains case 12 having connector holder 13 projecting from an outer surface thereof. Insulative body 14, disposed in case 12, has projection **14*a*, and busbar 15 is located between insulative body 14 and connector holder 13. Busbar 15 is bent at one end to form contact section 15*a* which is inserted through insertion opening 16 and projects into connector holder 13**.

Flexible printed substrate 17 is at the lower surface of case 12 and is preferably in the form of a three-layered structure, including a base film, a conductor layer (such as copper foil), and a cover film. The conductor layer is exposed at contact portion **17*a* which faces and is parallel to contact section 15*a* of busbar 15. Contact portion 17*a* is formed by bending one end of substrate 17 and is inserted into connector holder 13 so that it rests against projection 14*a* of insulative body 14. Contact section 15*a* and contact portion 17*a* are parallel to each other and to the axis of connection holder 13**.

Figure 2:
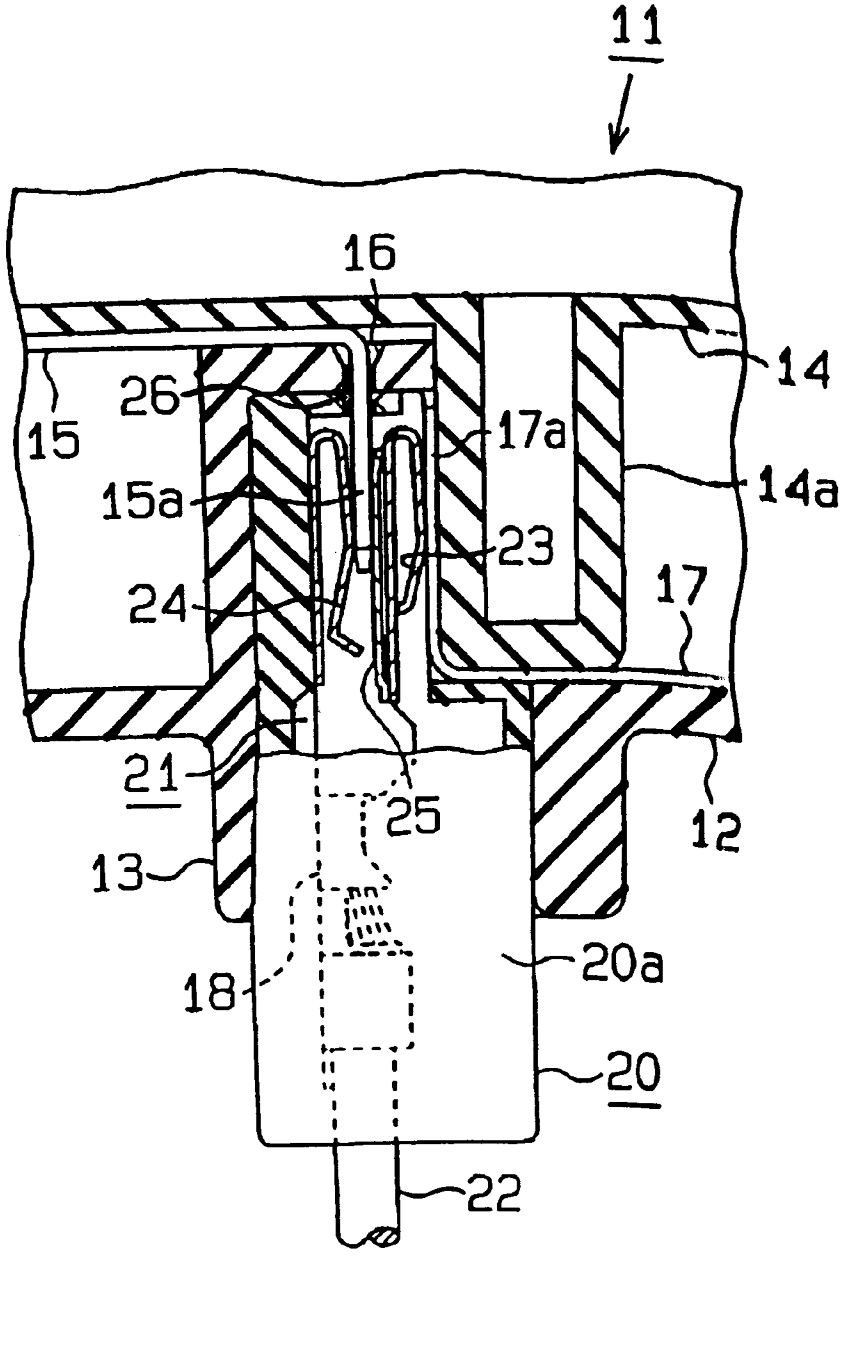
FIG. 2 is similar to that of FIG. 1 except that the connector has been fully inserted into the junction box.

Connector 20 composed of housing **20*a*, connection section 21, first contact terminal 23, and second contact terminal 24 is complementary to the internal shape of connector holder 13. Second contact terminal 24 has crimp 18 whereby the conductors of wire harness 22 are secured. First contact terminal 23 is provided with contact plate 25 and insertion hole 26 allows contact section 15*a* to pass through and enter the space between first terminal 23 and second terminal 24. The spacing is such that contact section 15*a*, when junction box 11 is in the position shown in FIG. 2, electrically contacts both first terminal 23 and second terminal 24. At the same time, contact portion 17*a* is sandwiched between first terminal 23 and projection 14*a*. This prevents any possible distortion, to which substrate 17** is subject because of its flexibility.

The resilience of terminals 23 and 24 assists in the formation of good electrical contact between both contact section 15*a* and contact portion 17*a*. In order that first terminal 23 contact contact portion 17*a*, access opening 20*b* is provided in connection section 21.

As can be seen from both Figures, connector 20 fits into connector holder 13. Contact section 15*a* passes through insertion hole 26 in order to be gripped between first and second terminals 23 and 24. At the same time, first terminal 23, through access opening 20*b*, is in firm contact with portion 17*a*. As can best be seen in FIG. 2, terminals 23 and 24 are elastically deformed and are thereby able to exert firm pressure on contact section 15*a* and contact portion 17*a* to insure good electrical contact.

The present Invention provides a simple means for connecting the busbar with the flexible substrate. A single connector is introduced into the connector holder and, without more, completes the circuit as desired. Thus, there is no need for separate and independent connectors to the busbar and also to the flexible substrate. This reduces the number of parts and greatly simplifies assembly. Since there are fewer parts, there is less chance of human error.

Moreover, the reduced number of parts takes up less space and, therefore, the junction box can be made smaller. In addition, by removing and inserting the connector, the circuit can be made or broken. Thus, the connector of the present Invention is able to perform a dual function as a switch.

In one of the preferred forms of the Invention, the contact portion and the contact section are parallel to each other and to the direction of insertion of the connector. Similarly, the contact terminals in the contact section may also be parallel to each other and to the contact section and contact portion in the case. As a result, it is very easy to slide the connector into the case and make the desired electrical connections.

Since the first terminal exerts pressure on the contact portion, the provision of the projection against which the portion rests prevents distortion or deformation thereof. This feature adds to the security of the connection and insures that contact will not be lost because the contact portion has been bent by the pressure of the first contact terminal.

Although only a limited number of specific aspects of the present Invention have been expressly disclosed, modifications which would suggest themselves to the person of ordinary skill may be made without departing from the scope or spirit thereof. It is not essential that the connector be removable from the connector holder; it is entirely within the present Invention that, once inserted, the connector is locked in place. Moreover, although elastic deformability of the terminals is preferable, it is unnecessary that they be so made. Plates of appropriate shape can be substituted therefor.

It is also advantageous to design the contact terminals so that they taper in the insertion direction. This increases the reliability of the connection between the busbar and the printed substrate.

While the Invention has been expressly disclosed in limited terms, it is, nonetheless, to be broadly construed and not to be limited except by the character of the claims appended hereto.

What we claim is:

1. A branch junction box assembly comprising at least one busbar having at least one contact section in electrical contact therewith, at least one flexible printed substrate having at least one contact portion in electrical contact therewith, a case having a space therein and surrounding said contact section and said contact portion, said contact section and said contact portion in said space and spaced apart from each other, a single connector introduced into said space in electrical contact with said contact section and said contact portion, whereby said busbar and said flexible printed substrate are electrically connected to each other.

2. The assembly of claim 1 wherein said connector is removable from said case.

3. The assembly of claim 1 wherein said contact section and said contact portion are substantially parallel to each other.

4. The assembly of claim 1 wherein said connector comprises a connection section containing a plurality of terminals substantially parallel to each other.

5. The assembly of claim 4 wherein said terminals are substantially parallel to said contact section and said contact portion.

6. The assembly of claim 4 wherein said connection section contains a first contact terminal and, spaced apart therefrom, a second contact terminal, said contact section between said first contact terminal and said second contact terminal and in electrical contact with both, said first contact terminal or said second contact terminal also in contact with said contact portion.

7. The assembly of claim 1 comprising an insulative projection in said space, said contact portion resting against said projection, whereby deformation of said contact portion is prevented.

8. The assembly of claim 4 wherein said terminal is resilient.

9. The assembly of claim 1 wherein said connector is complementary to said space.

10. The assembly of claim 7 wherein said contact portion is sandwiched between said connector and said projection.

11. The assembly of claim 1 wherein said contact section and said portion are in said space, said connector comprising a housing and a connection section, a first contact terminal and a second contact terminal in a hollow within said connection section, at least part of said connector being complementary to said space and disposed therein.

12. The assembly of claim 1 wherein said contact section, said contact portion, said first contact terminal, and said second contact terminal are parallel to each other and to an insertion direction of said connector into said case.

13. The assembly of claim 2 wherein there is an access opening between said hollow and said contact portion whereby said first contact terminal contacts said contact portion.

14. The assembly of claim 12 wherein there is an access opening between said hollow and said contact portion whereby said first contact terminal contacts said contact portion.

15. The assembly of claim 11 wherein there is a plate on said first contact terminal adapted to make contact with said contact section.

16. The assembly of claim 12 wherein there is a plate on said first contact terminal adapted to make contact with said contact section.

* * * * *